US005736749A

United States Patent [19]
Xie

[11] Patent Number: 5,736,749
[45] Date of Patent: Apr. 7, 1998

[54] INTEGRATED CIRCUIT DEVICE WITH INDUCTOR INCORPORATED THEREIN

[75] Inventor: Ya-Hong Xie, Flemington, N.J.

[73] Assignee: Lucent Technologies Inc., Murray Hill, N.J.

[21] Appl. No.: 751,472

[22] Filed: Nov. 19, 1996

[51] Int. Cl.$^6$ ............................................. H01L 29/00
[52] U.S. Cl. ............................. 257/3; 257/4; 257/528; 257/531
[58] Field of Search ........................ 257/531, 528, 257/3, 4

[56] References Cited

U.S. PATENT DOCUMENTS

| | | | |
|---|---|---|---|
| 5,508,559 | 4/1996 | Anderson et al. | 257/703 |
| 5,544,412 | 8/1996 | Romero et al. | 29/832 |
| 5,548,150 | 8/1996 | Omura et al. | 257/349 |
| 5,567,954 | 10/1996 | Dobson et al. | 257/3 |

FOREIGN PATENT DOCUMENTS

WO 93/21358  10/1993  WIPO ............................. B05D 3/02

OTHER PUBLICATIONS

"An Isolation Technique Using Oxidized Porous Silicon," Unagami, T. et al., JARECT vol. 8, *Semiconductor Technologies*, J. Nishizawa (ed.) OHMSHA Ltd. and North–Holland Publishing Co., pp. 139–154.

"Large Suspended Inductors on Silicon and Their Use in a 2 μm CMOS RF Amplifier", Chang, J.Y.–C., *IEEE Electron Device Letters*, No. 5, pp. 246–248 (May 1993).

"The Formation of Porous Silicon by Chemical Stain Etches," Beale, M.I.J. et al., *Journal of Crystal Growth* 75, pp. 408–414 (1986).

"FIPOS (Full Isolation by Porous Oxidized Silicon) Technology and its Application to LSI's", Imai, K. et al., *IEEE Transactions on Electron Devices*, vol. ED–31, pp. 297–302 (Mar. 1984).

"Atmospheric Impregnation of Porous Silicon at Room Temperature", Canham, L. T. et al., *J. Appl. Phys.*, 70(1), pp. 422–432 (Jul. 1991).

*Primary Examiner*—William Mintel
*Attorney, Agent, or Firm*—Richard J. Botos; Patricia A. Verlangieri

[57] ABSTRACT

The present invention is directed to a semiconductor device formed on a silicon substrate that has at least one inductor integrated therewith. The inductor is formed on a region of porous silicon formed in the substrate. The porous silicon reduces the capacitive and inductive coupling of the inductor to the substrate. Therefore, the integrated inductors of the present invention are capable of having a higher inductance at higher resonance frequencies (i.e. 2 GHz or greater) than conventional inductors. Devices with inductors that operate at these frequencies are desirable for wireless applications. The present invention is also directed to a process for fabricating the device in which the porous silicon is formed using an annodization technique, and wherein the porous silicon so formed is maintained in an essentially unoxidized state throughout the remainder of the process.

5 Claims, 2 Drawing Sheets

INTEGRATED CIRCUIT DEVICE WITH INDUCTOR INCORPORATED THEREIN

BACKGROUND OF THE INVENTION

1. Technical Field

This invention relates to semiconductor devices formed on silicon substrates with inductors incorporated therein.

2. Art Background

The manufacture of integrated circuit devices with inductors incorporated therein is desired for a variety of applications such as miniature wireless communications. As noted in Chang, J. Y. C. et al., "Large Suspended Inductors on Silicon and Their Use in a 2-μm CMOS RF Amplifier," *IEEE Electron Device Letters*, Vol. 14(5), pp. 246–248 (1993), one significant problem associated with incorporating passive components such as inductors into silicon-based devices is the parasitic capacitance between the inductor and the substrate.

It is well known that the operating frequency of an inductor must be lower than the inductor's resonance frequency ($f_r$). The $f_r$ of the inductor is defined by the relationship:

$$f_r = 1/(2\pi \sqrt{LC})$$

where L is the resonance frequency of the inductor and C is the parasitic capacitance. Since the operating frequency must be lower than the resonance frequency for circuit applications, the above equation dictates a maximum C for a given L.

The problem of parasitic capacitance increases as the size of the inductor increases. Since large-value inductors are sometimes desired for high-frequency applications, the capacitive coupling of the inductor to the silicon substrate must be reduced before it is feasible to form large-value inductors (e.g., inductances on the order of 100 nH) with $f_r > 1$ Ghz (the operating frequency in the current cellular telephone technology) integrated with circuits on silicon substrates.

The inductor should also have a quality factor (Q) that is at least about 10 if it is to be suitable for integration with circuits formed on silicon substrates. A low Q factor intricates either that the eddy current loss (inductive coupling) to the silicon substrate is too high, or the resistive losses in the metal (typically aluminum) lines that form the inductor spiral are too high, or a combination of both.

As an example, the self-resonance frequency of an inductor with an inductance of 10 nH and a Q-factor of 2 formed on a low resistivity (e.g. $\rho \leq 0.01$ Ω-cm) silicon substrate (commonly used in CMOS technology) is about 2 GHz. Any effort to increase Q by increasing the width of the metal lines that constitute the spiral inductor (thus decreasing the resistance) decreases the resonance frequency of the device. Since this also reduces the operating frequency of the device, increasing the width of the metal lines to increase Q is not a viable solution when the resonance frequency of the inductor is only slightly greater or less than the operating frequency.

Chang et al.'s solution to this problem is to form a locally insulating layer under the inductor by selectively etching out the silicon, leaving the inductor encased in a suspended silicon dioxide (oxide hereinafter) layer which is attached at the four corners of the etched-out area to the rest of the silicon-based integrated circuit. The problems associated with the solution proposed by Chang et al. are twofold. First, it is difficult to etch out the silicon from underneath the oxide layer with the inductor encased therein. The etching process used is not compatible with conventional silicon VLSI processing. Second, the resulting device is fragile because the etched out area provides no support for the inductor overlying it. Therefore, a more robust and manufacturable device that has an inductor formed thereon that is adequately isolated from the substrate is desired.

SUMMARY OF THE INVENTION

The present invention is directed to integrated circuit device formed on a silicon substrate. The device has at least one inductor formed on the silicon substrate and integrated with the circuit thereon. The inductor is formed on a region of essentially unoxidized porous silicon formed on the silicon substrate. The porous silicon region reduces the capacitive and inductive coupling between the inductor and the silicon substrate. The porous silicon region has a thickness of at least 2 μm in order to provide an observable reduction in the capacitive coupling between the inductor and the substrate. Thicknesses of at least about 200 μm will provide a significant reduction in the capacitive and inductive coupling between the inductor and the underlying substrate. It is advantageous if the thickness of the porous silicon region is at least about 400 μm.

In one optional embodiment of the present invention, a layer of insulating material is then formed over the porous silicon region. Examples of suitable insulating materials include silicon oxide and silicon nitride. The layer of insulating material is formed over the porous silicon region using any conventional deposition technique such as chemical vapor deposition (CVD) or a plasma deposition technique. It is advantageous if the insulating material has a thickness of about 10 nm to about 1000 nm. The layer of insulating material provides a seal for the porous silicon region, and prevents moisture of chemical solution from getting into the porous layer when the device is subjected to wet chemical processing.

The present invention is also directed to a process for fabricating the devices of the present invention. In the process, a region of porous silicon is formed on the silicon substrate on which the inductor is to be formed. The region of porous silicon is formed using conventional techniques well known to one skilled in the art. It is advantageous if the porous silicon is formed using an electrolytic process in which the silicon exposed to an electrolytic solution is anodized. Such techniques are described in Unagami, T., et al., "An Isolation Technique Using Oxidized Porous Silicon," *Semiconductor Technologies*, Vol. 8, Chap. 11, pp. 139–154 (OHMSHA and North-Holland Publishing Company 1983) which is hereby incorporated by reference. It is advantageous if the thickness of the porous silicon region is at least about 400 μm for 6-inch diameter silicon wafers. One skilled in the art will appreciate that, as the diameter oft he wafer increases, thicknesses of the porous silicon between the inductor and the substrate greater than 400 μm are possible without compromising the mechanical integrity of the wafer. The thickness of the porous silicon is readily controlled by controlling the amount of time that the silicon is subjected to the anodization conditions. After the porous silicon region is formed on the wafer, the wafer is not subjected to conditions which would substantially oxidize the porous silicon.

After the desired region of the substrate is anodized to form porous silicon, the inductor is formed on the porous silicon region. The inductor is formed on the porous silicon region by depositing a layer of conductive metal such as aluminum on the porous silicon region and patterning the aluminum to form a spiral with the desired dimensions using standard lithographic techniques. The advantage of the present process is that the device is not subjected to the high level of stress resulting from the difference between the coefficient of thermal expansion of the oxidized porous silicon and the coefficient of the thermal expansion of the bulk silicon. Such high levels of stress are potentially damaging to the devices formed on the silicon wafer.

In an optional embodiment of the present invention, a layer of insulating material is formed over the porous silicon layer in order to seal the porous silicon layer. Examples of suitable insulating materials include silicon dioxide ($SiO_2$) and silicon nitride ($SiN_x$). These layers are formed on the substrate using conventional techniques such as CVD and plasma deposition. Although in this embodiment a layer of $SiO_2$ is formed on the porous silicon layer, the porous silicon layer itself remains substantially unoxidized because the conditions under which the $SiO_2$ is formed on oxidize the porous silicon to any significant extent.

DETAILED DESCRIPTION

The present invention is directed to a semiconductor device formed on a silicon substrate with at least one inductor formed thereon. The inductor is integrated with the device and is formed over a region of porous silicon formed in the silicon substrate in order to reduce the capacitive and inductive coupling between the inductor and the silicon substrate. A device of the present invention is illustrated in FIG. 1.

Figure 1:
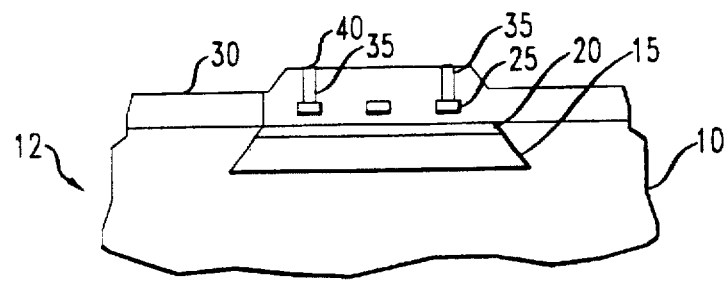
FIG. 1 is a cross sectional view of that portion of a device of the present invention with an inductor formed over a region of porous silicon.

In FIG. 1, a region of porous silicon 15 is formed in a silicon substrate 10. The regions of porous silicon is substantially unoxidized. The porous silicon layer must have a thickness of at least about 2 μm in order for there to be an observable reduction in the capacitive coupling between the inductor 25 and the substrate 10.

In an optional embodiment, a layer of an insulating material 20 is formed over the porous silicon region 15. Examples of suitable insulating materials include silicon dioxide and silicon nitride. It is advantageous if the thickness of the insulating layer is about 10 nm to about 1000 nm. The inductor 25 is formed over the insulating layer 20. The inductor 25 is a layer of metal such as aluminum which has been patterned into a spiral like configuration. A layer of a dielectric material 30 is formed over the inductor 25. Contact holes 35 are formed in the dielectric cap layer 30 and allow electrical connection to the inductor 25. The contact holes 35 are filled with a metal 40, thereby electrically interconnecting the inductor 25 with another portion of the device 12.

Figure 2A:
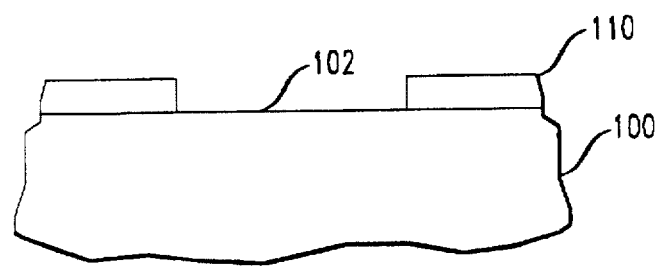
FIGS. 2A-2D is a schematic of the process of the present invention for forming an inductor on a silicon substrate.

A schematic of the process of the present invention is illustrated in FIGS. 2A-2D. As illustrated in FIG. 2A, a masking layer 110 of a material such as silicon nitride is formed over the substrate 100. The masking layer 110 is patterned using standard lithographic techniques so that only the portion 102 of the silicon substrate 100 on which the inductor is to be formed is exposed through the mask.

Figure 2B:
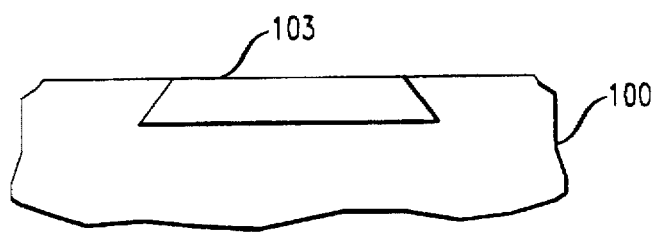

Referring to FIG. 2B, the silicon substrate 100 is then exposed to conditions that will convert the exposed silicon 102 (FIG. 2A) to porous silicon 103 (FIG. 2B). As previously noted, porous silicon is formed using selective anodization of the silicon wafer in a solution of hydrofluoric acid. Suitable conditions are described in U.S. Pat. No. 5,548,150 to Omura et al., which is hereby incorporated by reference. Conditions are selected such that the depth of the resulting porous silicon region 103 in the substrate 100 is at least about 200 μm. For six-inch diameter silicon wafers it is advantageous if the depth of the porous silicon region in the silicon substrate is at least about 400 μm. After the porous silicon region 103 is formed, the mask 110 (FIG. 2A) is optionally removed from the substrate.

Figure 2C:
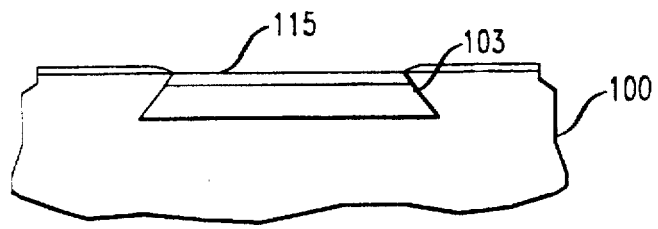

As illustrated in FIG. 2C, a layer of an insulating material 115 is formed over the porous silicon region. The insulating material 115 is deposited on the porous silicon using a deposition technique such as CVD or plasma deposition. It is advantageous if the thickness of the insulating layer is about 10 nm to about 1000 nm. As previously stated, the formation of the insulating layer is an optional embodiment of the present invention.

Figure 3:
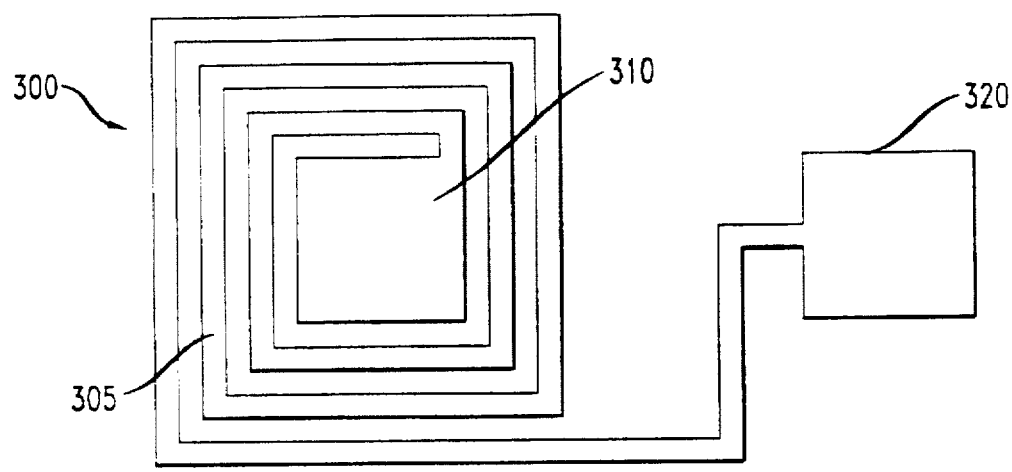
FIG. 3 is a top view of an exemplary inductor configuration used in the present invention.

A layer of metal is then selectively formed on the porous silicon and the layer is patterned using conventional lithographic techniques to form an inductor 130. Typically, the inductor 130 is a continuous strip of metal in a spiral-like configuration. An exemplary inductor configuration is illustrated in FIG. 3. The inductor 300 is a metal strip 305 that has a spiral like configuration with pads 310 and 320. Electrical connection to the inductor is made via the pads 310 and 320. Typical metals include aluminum, aluminum alloys, copper, copper alloys, and the like materials.

Figure 2D:
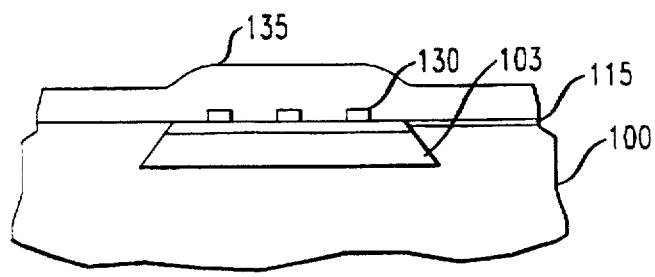

As depicted in FIG. 2D, a layer of dielectric material 135 is then formed over the inductor 130. The dielectric layer 135 is formed over the inductor 130 using standard techniques well known to one skilled in the art. Vias (not shown) are then formed in the dielectric layer to enable the inductor 130 to be electrically interconnected with other circuitry.

The following example is provided to illustrate a specific embodiment of the present invention.

EXAMPLE 1

A p-type <100> silicon wafer with a 2-inch diameter that had a measured resistivity in the range of 0.008 to 0.018 ohm-cm was placed in an electrochemical cell. The wafer was fastened between two metal plates. An aperture in one of the plates allowed fluid communication between the polished top surface of the wafer and the electrolyte solution of an electrochemical cell. The electrolyte was a 1:1 (by volume) solution of hydrofluoric acid and alcohol. A platinum cathode was placed in the solution. In ambient light a current density of 100 mA/cm$^2$ was applied to the cell. This current density provided an etch rate of about 5 μm/min and a porosity of about 60 percent to the exposed silicon. After about 10 minutes, the current was shut off and the wafer was removed from the cell. The depth of the porous silicon region in the substrate was 50 μm and was measured using scanning electron microscopy (SEM).

Using a standard plasma enhanced CVD technique, a 1000 Å-thick layer of oxide was formed over the porous silicon layer. A 1 μm-thick layer of aluminum was then sputtered onto the oxide layer and, using standard lithographic techniques, a spiral-like pattern was formed in the aluminum layer. The inductor was characterized using an Hewlett-Packard Network Analyzer. The inductor has an inductance of 1.4 nH and a capacitance of 0.03 pF.

If the porous silicon region had not been formed on the above described device, the capacitance of the inductor would have been at least about 0.2 pF. Clearly, the use of a porous silicon layer lowered the capacitance of the inductor. Since inductor capacitance is related to the thickness of the porous silicon layer, one would expect an even greater reduction in capacitance if the thickness of the porous silicon was greater than 50 µm. For example, if the thickness of the porous silicon in the above-described device was 200 µm, one would expect the capacitance of the inductor to be less than 0.01 pF. Such a result is explained by the fact that increasing the thickness of the porous silicon by a factor of four decreases the inductor capacitance by a factor of four.

What is claimed is:

1. A semiconductor device comprising:

a silicon substrate;

a region of porous silicon formed in the substrate, wherein the region of porous silicon is essentially unoxidized; and an inductor formed on the porous silicon region wherein the position of the inductor on the silicon substrate is within the boundaries of the region of porous silicon.

2. The device of claim 1 wherein the region of porous silicon has a depth of at least about 200 µm in the substrate.

3. The device of claim 2 wherein the region of porous silicon has a depth of at least about 400 µm in the substrate.

4. The device of claim 1 further comprising a layer of an insulator material between the porous silicon region and the inductor wherein the insulator material is selected from the group consisting of silicon dioxide and silicon nitride.

5. The device of claim 4 wherein the thickness of the insulator material is about 10 nm to about 1000 nm.

* * * * *